United States Patent [19]

Crandall

[11] 3,919,655

[45] Nov. 11, 1975

[54] HIGH POWER OPERATIONAL AMPLIFIER

[75] Inventor: Richard Eugene Crandall, Cambridge, Mass.

[73] Assignee: Electronics Research Group, Inc., Arlington, Mass.

[22] Filed: Dec. 26, 1973

[21] Appl. No.: 428,212

[52] U.S. Cl. .................... 330/30 D; 330/17; 330/22; 330/28; 330/207 P

[51] Int. Cl.[2] .................... H03F 3/68

[58] Field of Search ...... 330/9, 23, 30 D, 69, 207 P, 330/13, 17, 22, 28

[56] References Cited

UNITED STATES PATENTS

| | | | |
|---|---|---|---|
| 3,469,202 | 9/1969 | Priddy | 330/17 X |
| 3,471,794 | 10/1969 | Gugliotti | 330/23 |
| 3,681,659 | 8/1972 | Suzuki | 330/207 P X |
| 3,760,288 | 9/1973 | Leonard | 330/30 D |
| 3,818,361 | 6/1974 | Gonda | 330/15 |

OTHER PUBLICATIONS

Gagnon et al., – "Complementary Output Stage Improves Op–Amp Response," Electronics, p. 110, Sept. 25, 1972.

*Primary Examiner*—R. V. Rolinec
*Assistant Examiner*—Lawrence J. Dahl
*Attorney, Agent, or Firm*—Robert F. O'Connell

[57] ABSTRACT

A high power operational amplifier circuit using a differential amplifier device of the 741-type, which circuit includes a complementary pair of Darlington output transistors, a resistance-diode biasing network for each of said transistors and a capacitance connected across the power pins of the differential amplifier, the values of the resistances of the biasing networks and the latter capacitance being selected to prevent crossover distortion and to provide thermal stability, the latter being further enhanced by providing a thermal bond between the diodes and their corresponding Darlington transistors. A resistive negative feedback network is also preferably used to provide optimum frequency roll-off response characteristics. The overall circuit can be used to provide average power outputs up to several hundred watts, or higher, at loads as low as one to two ohms.

6 Claims, 5 Drawing Figures

HIGH POWER OPERATIONAL AMPLIFIER

This invention relates generally to amplifier circuits and, more particularly, to high power amplifier circuits using differential operational amplifier devices having a relatively high short circuit source current.

BACKGROUND OF THE INVENTION

In operational power amplifier applications, such as in DC servo amplifier circuitry and in audio amplifier circuiry, for example, wherein it may be necessary to drive relatively heavy loads at power outputs up to as high as 50 to 100 watts or in some cases as high as several hundred watts, or more, it is often desirable that such amplifier have a relatively wide unity-gain bandwidth characteristic and good DC linearity with low harmonic distortion of the output signal. Further, the amplifier should be provided with good heat dissipation characteristics and should be capable of operating with an electrically isolated heat sink. Further, while most such amplifiers are conventionally designed for double-ended voltage supply, they should also have compatibility for use with a single ended voltage supply.

DESCRIPTION OF THE PRIOR ART

One operational amplifier device which has been found to provide advantageous use in power amplifier circuitry is manufactured and sold under the general designation of a "741-type" operational amplifier, one version thereof being made and sold by the Fairchild Semiconductor Division of Fairchild Camera and Instruments Corporation, Mountain View, Calif. under the model designations "μA741" and "μA741C". This operational amplifier device is a differential amplifier which has a relatively high, short-circuit source current, i.e., a short-circuit source current of about 10 milliamps, or greater. Such devices are high performance, monolithic operational amplifiers constructed on a single silicon chip and provide a relatively high gain and a wide range of operating voltages for use in integrator, summing amplifier and general feedback applications. They require no external components for frequency compensation and are generally stable for many closed loop applications over relatively wide temperature ranges.

Although the 741-type amplifier is useful in many applications, it has been found that when attempts are made to use it as a power amplifier in a manner suggested by at least one manufacturer (see Application notes of Fairchild Semiconductor Division "μA741 Frequency-Compensated Operational Amplifier" and "μA741C Internally-Compensated Operational Amplifier"), it has two principal disadvantages. First of all, the suggested power amplifier circuitry tends to become thermally unstable at relatively high power levels above about 10 watts. Secondly, such circuitry cannot provide sufficient power to drive relatively heavy loads, for example, loads under about 15 ohms. Accordingly, such disadvantages make such power amplifier circuitry inapplicable for many audio and servo applications.

Improvements in such circuitry for use with higher voltage suppllies in an attempt to obtain a high voltage power amplifier capable of delivering higher power at higher output voltage swings, are proposed in the article "Getting Power and Gain out of the 741-type Op Amp," P. P. Garza, Electronics, Feb. 1, 1973. The circuitry suggested by Garza is found to be incapable of driving loads of less than about 40 ohms and appears to be capable of providing powers up to only about 5 watts at such loads.

SUMMARY OF THE INVENTION

This invention relates to improved power amplifier circuitry using an operational differential amplifier device having a relatively high short-circuit source current, such as the 741-type operational amplifier device. The circuitry of the invention maintains excellent thermal stability at relatively high power levels and is capable of driving relatively heavy loads, as low as about 1 to 2 ohms, or less.

In accordance with the invention, the conventional output power transistors normally used in presently known 741-type power amplifier circuitry, are replaced by a complementary pair of highgain Darlington output transistors, each of which is used in combination with a unique resistance-diode biasing network. Further, a thermal contact, or bond, is provided between the Darlington output transistors and the diodes of such networks, the bias resistors being selected so that crossover distortion is avoided without producing thermal "runaway" wherein the temperature levels and currents of the output transistors become unstable and rapidly build up to excessive and undesired high values so as to drastically impair or destroy the circuit operation. Further, the capacitance feedback network used in conventional 741-type power amplifier circuitry is replaced by a resistance to produce a more stable frequency response for the overall circuit.

The details of the circuitry of the invention can be understood more fully with the assistance of the accompanying drawings wherein FIGS. 1 and 2 show operational amplifier circuits suggested by the prior art;

Figure 1:
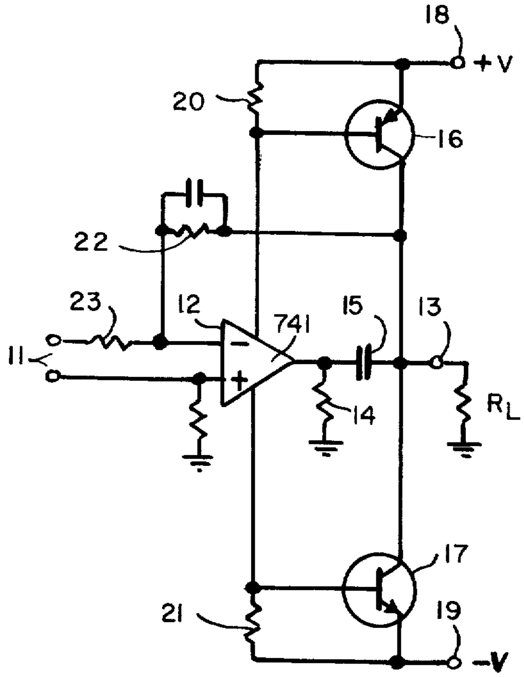
PRIOR ART FIG. 1

As can be seen in FIG. 1, a 741-type integrated circuit device is used in an operational power amplifier circuit of the prior art for driving a load indicated schematically by the resistance $R_L$, as described in the above referenced Fairchild Application notes. An input signal is applied to input terminals 11 via suitable input resistors to the positive and negative inputs of a 741-type operational amplifier device 12 and the output signal for the load $R_L$ is taken from output terminal 13. A negative feedback RC output network comprising resistor 14 and capacitor 15 is used to provide a frequency roll-off characteristic, purportedly to assure stability of operation.

A pair of balanced power transistors 16 and 17 are connected between the output terminal and positive and negative voltage sources, respectively, which are applied to voltage supply terminals 18 and 19, such terminals typically being supplied with ± 15 volts, respectively. Biasing resistors 20 and 21 are used in the output transistor circuits and the voltage gain of the amplifier is effectively determined by the ratio of feedback resistance 22 to input resistance 23.

The circuitry shown in FIG. 1 is not useful for relatively heavy loads and will normally operate only with loads down to about 15 ohms, or higher, and, at such loads, does not deliver power outputs much greater than about 5 watts. The circuit can produce a condition known as thermal "runaway" wherein a current increase in the output transistors causes a temperature increase thereof which in turn causes a further current increase so that the circuit becomes unstable.

Figure 2:
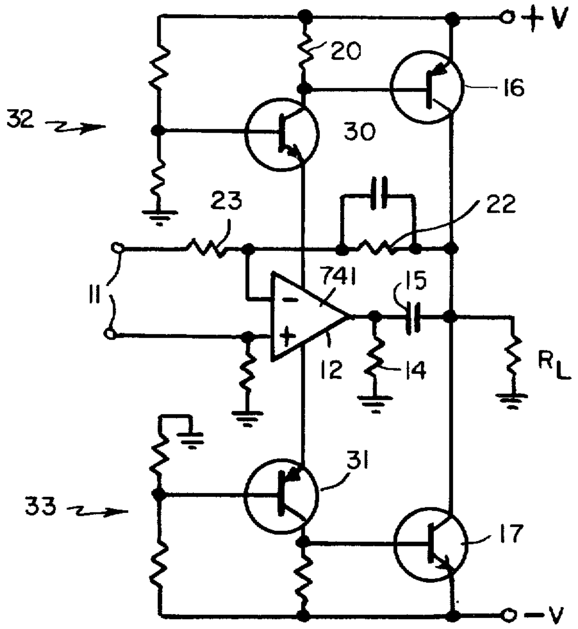
PRIOR ART FIG. 2

Attempts to improve the operation of the power amplifier circuitry of FIG. 1 have resulted in a circuit of the type shown in FIG. 2, described in the above referenced Garza article. The DC voltage supplies are increased to ± 30 volts and in order to protect the 741-type operational amplifier device, which is not designed to accept greater than about 36 volts across the power pins, a pair of transistor circuits comprising transistors 30 and 31 and resistance voltage divider networks 32 and 33 are used to maintain an approximate 30 volt differential across the 741 device. Other than such a change, the circuit of FIG. 2 is substantially the same as that shown in FIG. 1. It is found, however, that such a configuration is unable to drive loads lower than about 40 ohms and, while the circuit is nominally designed to deliver 22 watts of peak power, the average power output is only about 5 watts. Moreover, the use of a capacitance negative feedback network produces undesirable frequency roll-off characteristics which are difficult to control and which produce undesirable overshoots and, hence, output signal distortion. Moreover, temperature stability, even at moderately heavy loads, tends to be poor and that factor coupled with an inability to provide high power outputs at heavy loads severally limits the usefulness of the circuit of FIG. 2.

Up to the present time the 741-type of linear integrated circuit amplifier has not been adapted for use under heavy load conditions and, particularly, has not found any significant use for audio or servo amplifier applications requiring high power and good temperature stability. Other more expensive amplifier circuitry must be used in such applications so that the costs required to achieve the desired power outputs have remained relatively high.

Figure 3:
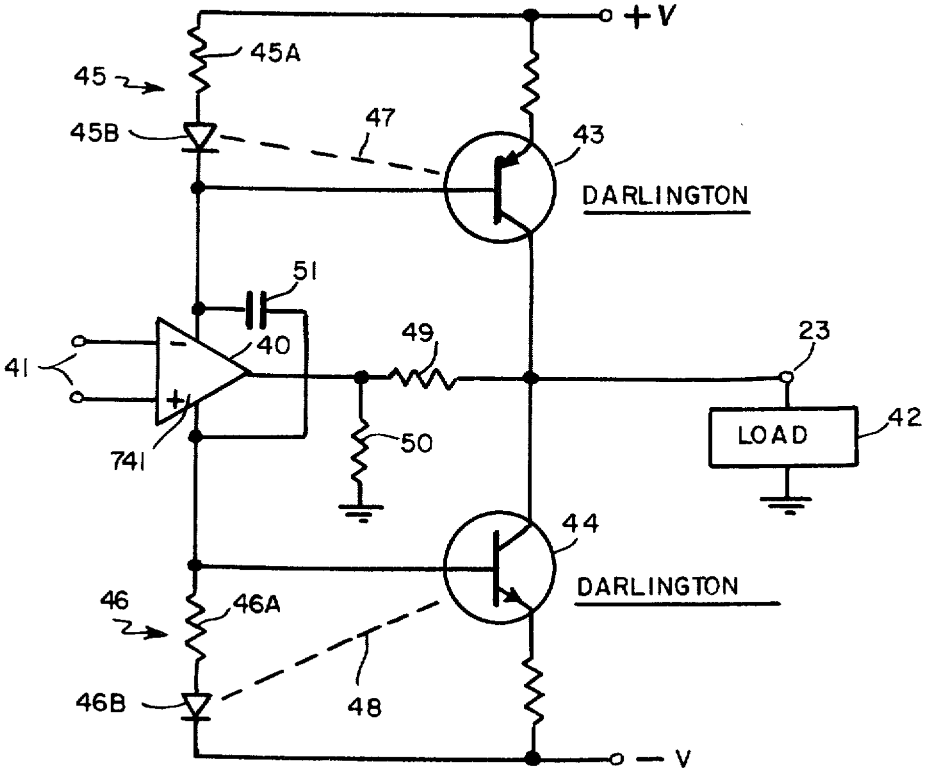
FIG. 3 shows a preferred embodiment of a high power operational amplifer circuitry of the invention.
Figure 4:
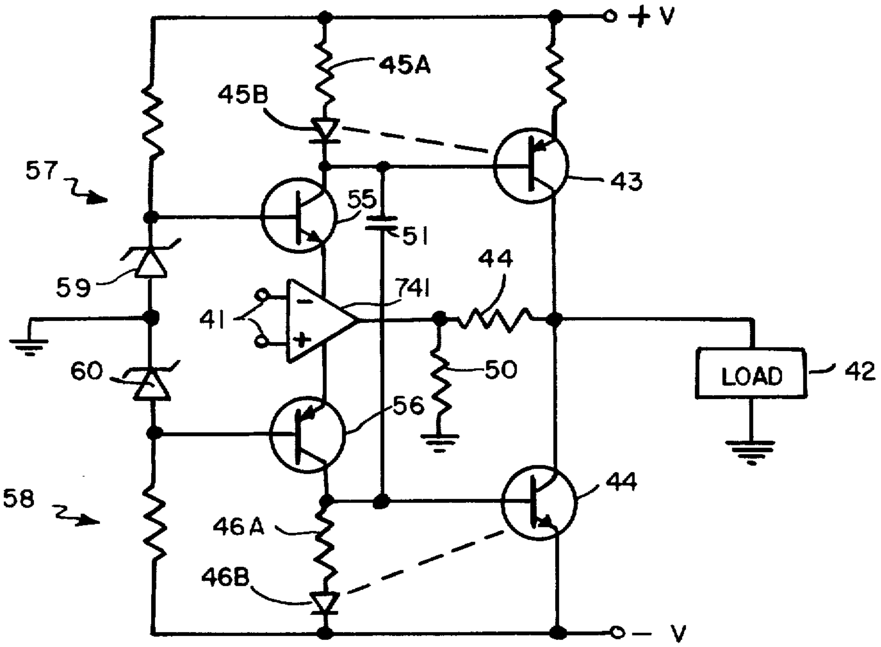
FIG. 4 shows another embodiment of the circuitry of the invention.
Figure 5:
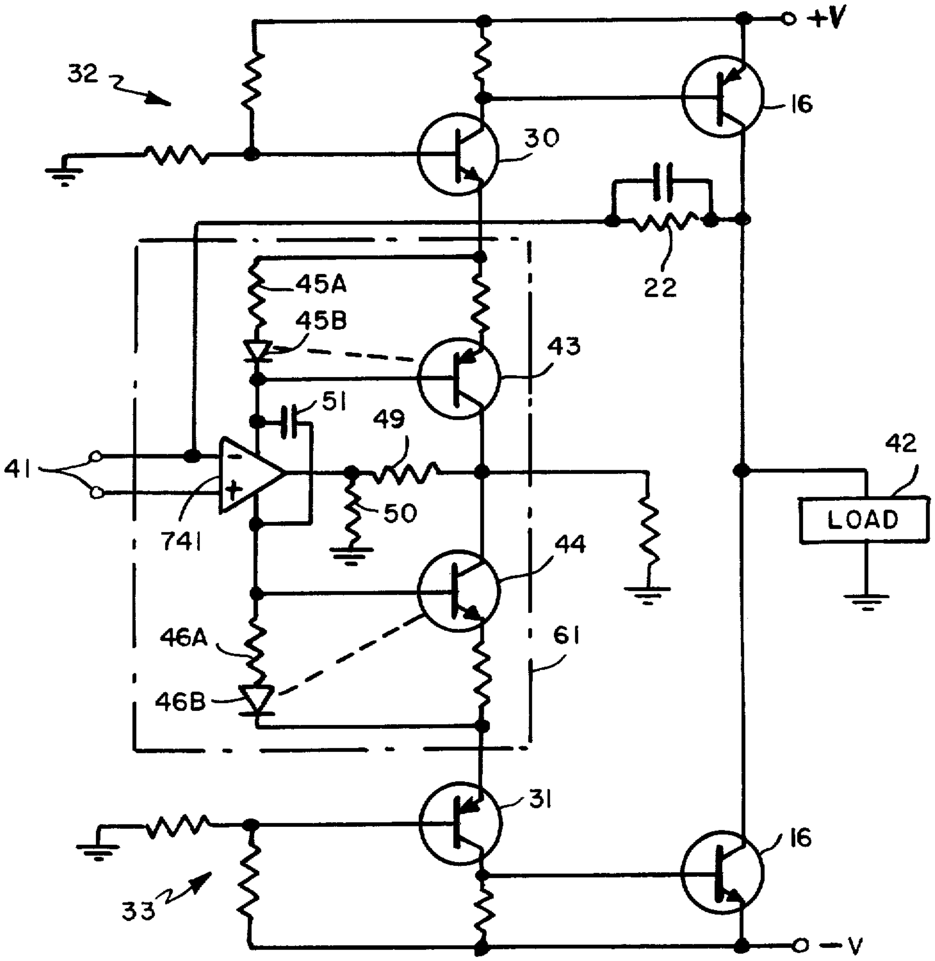
FIG. 5 shows still another embodiment of the circuitry of the invention.

The circuitry of the invention as shown and described with reference to the embodiments depicted in FIGS. 3–5 is designed to use the advantageous characteristics of the 741-type linear integrator circuit devices with its high, short-circuit source current for use under relatively heavy load conditions in a manner which provides temperature stability in operation at a cost which is relatively small in comparison with presently used high power amplifier circuits.

As can be seen in FIG. 3, a 741-type operational amplifier device 40 accepts an input signal to be amplified at input terminals 41 and provides an output signal to a load 42 at output terminal 23. Positive and negative voltage sources +V and −V, respectively, are used to supply the power inputs to the amplifier device 40 and to a complementary pair of Darlington output transistors 43 and 44, respectively. A pair of resistance-diode series networks 45 and 46, respectively, each comprising resistors 45A and 46A and diodes 45B and 46B, as shown, are connected as biasing networks across the Darlington output transistors.

Thermal contacts, or bonds, designated schematically by dashed lines 47 and 48, are arranged between diodes 45B and 46B and their associated Darlington transistors 43 and 44, respectively, so that each pair of such associated elements operates at substantially the same temperature level at all times. Such an arrangement assists in maintaining temperature stability and tends to prevent the thermal "runaway" associated with the prior art circuits.

The Darlington output transistors are of well-known types such as presently designated, for example, by Model Nos. MJ2501 and MJ3001, a complementary pair thereof manufactured and sold by Motorola Corporation, Chicago, Illinois. Such transistors are essentially very high gain transistors which permit the drawing of relatively heavy currents to drive the heavy loads required in many applications.

The feedback network at the output of the 741-type device comprises a series resistance 49 together with resistance 50 parallel connected to ground as shown. It is found that if a ratio of resistance values of about 5:1 is maintained between resistance 49 and resistance 50, the frequency roll-off characteristic can be maintained at the desired Bode shape and overshoots are essentially limited and distortion is considerably reduced. Values of about 500 ohms and about 100 ohms for resistances 49 and 50, respectively, have been found to provide good results over a wide range of loads and power outputs.

In providing the desired resistance-diode biasing networks 45 and 46 it is found that the selection of the resistance value of resistors 45A and 46A is critical. As is well known, the push-pull output signal requires crossover control to permit slight overlapping of the turn-on times of the transistors to provide for substantially simultaneous conduction thereof at the cross-over point to prevent cross-over distortion. At the same time, the transistors should not draw too much current which would overheat them and tend to cause the thermal runaway problem discussed above. In the circuit of the invention the values of the biasing resistors 45A and 46A must be selected to prevent the drawing of too much current to avoid runaway, which may occur at too large currents even if the diodes and transistors are in thermal contact, and at the time to permit sufficient current conduction to avoid cross-over distortion.

While the selection thereof can be carefully made by suitable trimming techniques in order to tailor-make each circuit which is made in accordance with the configuration of FIG. 3, such a process increases the costs of such circuitry when made on a production basis. Accordingly, it has further been found that production models of such circuitry can readily be made by selecting a value of resistance which is lower than that normally deemed to be required for optimum cross-over operation and by placing a capacitance 51 across the input leads to the 741-type amplifier device. The use of the latter capacitance assures that the operation of the overall circuit provides excellent cross-over characteristics without drawing excessive current through the transistors. In a practical circuit for supplying loads down to 1 or 2 ohms for the circuitry of FIG. 3, for example, the value of resistors 45A and 46A can be about 200 ohms and the value of capacitance 51 can be within a range from as low as about 0.1 $\mu$farad up to about 10 $\mu$farads.

The circuit of FIG. 3 has been found to provide excellent frequency response, low distortion and good temperature stability at average power output levels up to about 15–20 watts and at loads as low as 1 or 2 ohms.

The circuit of FIG. 3 can be further enhanced for average power outputs even higher, up to 50 to 100 watts by the modification thereof, shown in FIG. 4, wherein like elements are given like reference numerals. This configuration is used with higher DC power input voltages, designated by ± V, wherein the values thereof may be about ± 30 volts. To protect the 741-type device, as discussed above, the transistor circuits comprising transistors 55 and 56 and voltage divider networks 57 and 58, as shown, are used to maintain the desired voltage differential across the 741 device. In this instance the conventional resistances to ground at the base of transistors 55 and 56 are replaced by Zener diodes 59 and 60 to assure greater stability of the voltages at the 741 amplifier.

The circuit of FIG. 4 has been found to provide operation at average power outputs of as high as 100 watts or more at loads as low as 1 to 2 ohms or less, with good frequency response, low distortion and good thermal stability.

The circuitry of the invention has found further use at even higher power outputs when used in the manner shown in FIG. 5. As can be seen therein, the general circuit shown in FIG. 2 has been utilized and the 741-type operational amplifier device has been replaced by the amplifier circuitry of FIG. 3 (effectively enclosed by the dot-dash line 61), with like elements being designated by like reference numerals. This circuit has been found to be capable of delivering up to several hundred watts and can be expected to operate satisfactorily up to about 1000 watts, being limited only by the current capacity of the output transistors, with loads as heavy as 1 to 2 ohms without appreciable frequency response deterioration or increase in distortion and with good thermal stability.

Although the particular embodiments of the invention specifically shown in FIGS. 3–5 are preferable at the present time, modification thereto may occur to those skilled in the art without departing from the spirit and scope of the invention. Hence, the invention is not to be construed as limited to the particular embodiments shown and described herein, except as defined by the appended claims.

What is claimed is:

1. An amplifier circuit comprising a differential amplifier device responsive to an input signal for supplying amplified output signals;

means for supplying said device with power from positive and negative voltage sources;

a complementary pair of Darlington output transistor means the emitters of which are connected to said voltage sources, the collectors of which are connected to each other and to the output of said circuit and the bases of which are connected to power inputs of said differential amplifier device;

network means for biasing each of said output transistor means, each biasing network means including diode means; and resistance means in series with said diode means;

means for providing a thermal contact between each of said diode means and its associated output transistor means; and a negative feedback network for controlling the frequency roll-off response characteristics of said circuit, said feedback network including a first divider resistance means connected between the output of said differential amplifier and the output of said circuit; and a second divider resistance means connected between the output of said differential amplifier and a reference point.

2. An amplifier circuit in accorance with claim 1 and further including capacitance means connected across said differential amplifier device;

the values of the resistance means of each of said biasing network means and of said capacitance means being selected to provide a current through said output transistors at a level which prevents cross-over distortion in the output signal of said circuit and which prevents thermal instability in the operation of said output transistors.

3. An amplifier circuit in accordance with claim 2 wherein the value of the resistance of each of said biasing network means is about 200 ohms and the value of said capacitance means is within a range from about 0.1 $\mu$farad to about 10 $\mu$farads.

4. An amplifier circuit in accordance with claim 1 wherein the ratio of the values of said first divider resistance means to said second divider resistance means is about 5:1.

5. An amplifier circuit in accordance with claim 1 and further including a pair of protective transistor circuit means positioned between said power supplying means and said differential amplifier device for preventing the voltage difference supplied to said differential amplifier from exceeding a selected value; each of said protective circuits including transistor means connected between said diode means of the associated biasing network means and said differential amplifier device;

voltage regulation means for providing a fixed voltage at said transistor means independently of variations in said positive and negative voltage sources, said voltage regulation means comprising a voltage divider means comprising resistance means; and Zener diode means.

6. An amplifier circuit in accordance with claim 1 and further including a second complementary pair of power amplifying output transistors connected to said voltage sources and to the output of said amplifier circuit for providing additional power output from said amplifier circuit; and a pair of protective transistor circuit means positioned between said power supplying means and said amplifier circuit for preventing the voltage difference supplied to said amplifier circuit from exceeding a selected value.

* * * * *